United States Patent
Lin et al.

(10) Patent No.: US 8,049,273 B2
(45) Date of Patent: Nov. 1, 2011

(54) SEMICONDUCTOR DEVICE FOR IMPROVING THE PEAK INDUCED VOLTAGE IN SWITCHING CONVERTER

(75) Inventors: Wei-Chieh Lin, Hsinchu (TW); Ho-Tai Chen, Taipei County (TW); Li-Cheng Lin, Taipei (TW); Jen-Hao Yeh, Kaohsiung County (TW); Hsin-Yen Chiu, Taichung County (TW); Hsin-Yu Hsu, Chiayi County (TW); Shih-Chieh Hung, Changhua County (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 378 days.

(21) Appl. No.: 12/371,618

(22) Filed: Feb. 15, 2009

(65) Prior Publication Data

US 2010/0117142 A1 May 13, 2010

(30) Foreign Application Priority Data

Nov. 10, 2008 (TW) ................................ 97143307 A

(51) Int. Cl.
*H01L 26/66* (2006.01)

(52) U.S. Cl. ........ 257/330; 257/341; 257/386; 257/387; 257/401; 257/502; 257/E29.027; 257/E29.028; 257/E29.066; 257/E29.067; 257/E29.257; 257/E21.382; 257/E21.417; 257/E21.418; 257/E21.419; 257/E29.26; 438/135; 438/197; 438/201; 438/268

(58) Field of Classification Search .................. 257/330, 257/341, 386, 387, 401, 502, E21.38, E21.382–E21.385, 257/E21.517, E21.41, E21.418, E21.419, E21.42, E29.027, E29.028, E29.066, E29.067, E29.226, E29.256, E29.257, E29.26, E29.274; 438/135, 151, 197, 199, 201, 268

See application file for complete search history.

(56) References Cited

U.S. PATENT DOCUMENTS

| | | | |
|---|---|---|---|
| 6,777,295 B1 | 8/2004 | Lin | |
| 6,806,548 B2 | 10/2004 | Shirai | |
| 6,809,349 B2 | 10/2004 | Yamaguchi | |
| 7,037,788 B2 | 5/2006 | Ito et al. | |
| 7,253,473 B2 | 8/2007 | Nakamura | |
| 2004/0041207 A1* | 3/2004 | Takano et al. | 257/330 |
| 2010/0044792 A1* | 2/2010 | Hebert | 257/341 |

* cited by examiner

*Primary Examiner* — Benjamin Sandvik
*Assistant Examiner* — Farid Khan
(74) *Attorney, Agent, or Firm* — Winston Hsu; Scott Margo

(57) ABSTRACT

A power semiconductor device includes a backside metal layer, a substrate formed on the backside metal layer, a semiconductor layer formed on the substrate, and a frontside metal layer. The semiconductor layer includes a first trench structure including a gate oxide layer formed around a first trench with poly-Si implant, a second trench structure including a gate oxide layer formed around a second trench with poly-Si implant, a p-base region formed between the first trench structure and the second trench structure, a plurality of n+ source region formed on the p-base region and between the first trench structure and the second trench structure, a dielectric layer formed on the first trench structure, the second trench structure, and the plurality of n+ source region. The frontside metal layer is formed on the semiconductor layer and filling gaps formed between the plurality of n+ source region on the p-base region.

12 Claims, 7 Drawing Sheets

SEMICONDUCTOR DEVICE FOR IMPROVING THE PEAK INDUCED VOLTAGE IN SWITCHING CONVERTER

BACKGROUND OF THE INVENTION

1. Field of the Invention

The present invention relates to a power semiconductor device, and more particularly, to a power semiconductor device capable of improving voltage spike effect produced during switching and stability of the manufacturing process.

2. Description of the Prior Art

A trench power transistor is a typical semiconductor device in power management application, such as switching power supplies, power control ICs of computer systems or peripherals, power supplies of backlight, motor controllers, etc. With the high switching speed of the trench power transistor, a voltage spike effect produced during switching may affect operating performance. Therefore, to solve the above-mentioned problem, the ratio of the input capacitance to the reverse transfer capacitance of the trench power transistor needs to be enhanced to an optimal value for suppressing the voltage spike effect.

In order to improve the voltage spike effect produced during switching, the prior art provides modifications on the structure of the trench power transistor to optimize the ratio of the input capacitance to the reverse transfer capacitance. For example, U.S. Pat. No. 7,253,473, U.S. Pat. No. 7,037,788, U.S. Pat. No. 6,809,349, U.S. Pat. No. 6,806,548, and U.S. Pat. No. 6,777,295 disclose trench semiconductor devices which form a gate electrode upon the trench surface by reducing the trench depth, so as to enhance the ratio of the input capacitance to the reverse transfer capacitance of the trench power transistor. However, through the above-mentioned structures, several problems, such as non-uniform implant or unusual P-N junction avalanche, often occur.

SUMMARY OF THE INVENTION

It is therefore a primary objective of the claimed invention to provide a power semiconductor device.

The present invention discloses a power semiconductor device, which comprises a backside metal layer, a substrate, a semiconductor layer, and a frontside metal layer. The substrate is formed on the backside metal layer. The semiconductor layer is formed on the substrate, which comprises a first trench structure, a second trench structure, a p-base region, a plurality of n+ source regions, and a dielectric layer. The first trench structure comprises a gate oxide layer formed around a first trench with poly-Si implant. The second trench structure comprises a gate oxide layer formed around a second trench with poly-Si implant. The p-base region is formed between the first trench structure and the second trench structure. The plurality of n+ source regions is formed on the p-base region and between the first trench structure and the second trench structure. The dielectric layer is formed on the first trench structure, the second trench structure, and the plurality of n+ source regions. The frontside metal layer is formed on the semiconductor layer and filling gaps formed between the plurality of n+ source regions on the p-base region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
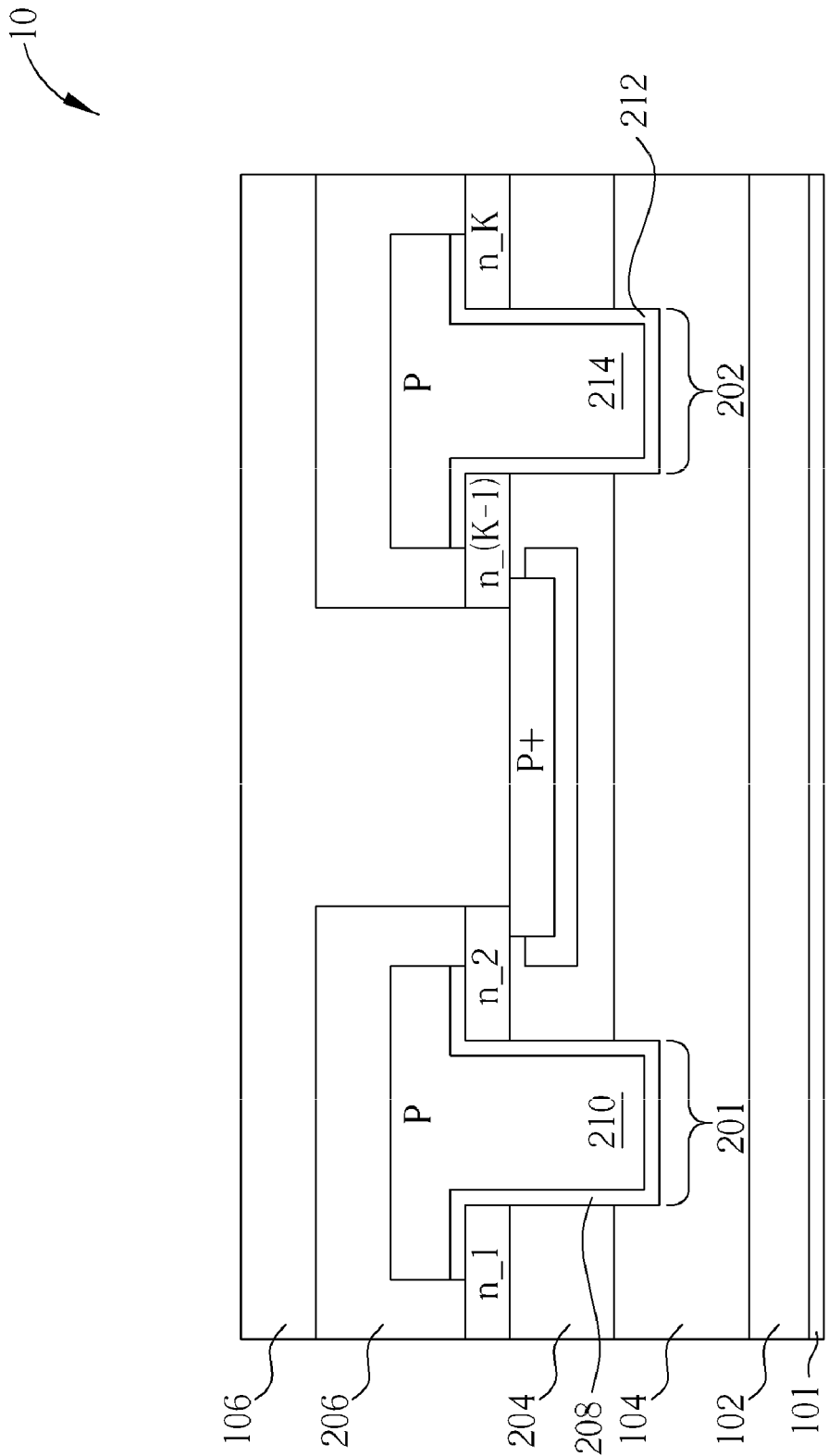
FIG. 1 is a cross-sectional diagram of a trench power transistor according to an embodiment of the present invention.

Please refer to FIG. 1, which illustrates a cross-sectional diagram of a trench power transistor 10 according to an embodiment of the present invention. The trench power transistor 10 is utilized for implementing a power semiconductor device, which includes a backside metal layer 101, a substrate 102, a semiconductor layer 104, and a frontside metal layer 106. The substrate 102 is formed on the backside metal layer 101. The semiconductor layer 104 is formed on the substrate 102, which comprises a first trench structure 201, a second trench structure 202, a p-base region 204, a plurality of n+ source regions n_1~n_k, and a dielectric layer 206. The first trench structure 201 includes a gate oxide layer 208 formed around a first trench 210 with poly-Si implant. The second trench structure 202 includes a gate oxide layer 212 formed around a second trench 214 with poly-Si implant. The p-base region 204 is formed between the first trench structure 201 and the second trench structure 202. The plurality of n+ source regions n_1~n_k is formed on the p-base region 204 and between the first trench structure 201 and the second trench structure 202. The dielectric layer 206 is formed on the first trench structure 201, the second trench structure 202, and the plurality of n+ source regions n_1~n_k. The frontside metal layer 106 is formed on the semiconductor layer 104 and filling gaps formed between the plurality of n+ source regions n_1~n_k on the p-base region 204. Preferably, each of the gaps formed between the plurality of n+ source regions n_1~n_k on the p-base region 204 includes a p+ contact region.

In the semiconductor layer 104, the first trench structure 201 and the second trench structure 202 form gates of the trench power transistor 10, the n+ source regions n_1~n_k form sources of the trench power transistor 10, and the backside metal layer 101 forms a drain of the trench power transistor 10. Preferably, the first trench structure 201 includes a top end extension region P extended from top end of the first trench 210 to both sides of the first trench 210 with poly-Si implant. In addition, the gaps formed by the plurality of n+ source regions n_1~n_k on the p-base region 204 are separated from the top end extension region P and not overlapped with the top end extension region P. In an embodiment of the present invention, after the substrate 102 and the semiconductor layer 104 are formed in the manufacturing process of the trench power transistor 10, the first trench structure 201 and the second trench structure 202 are formed on the semiconductor layer 104. Again, the p-base region 204 and the plurality of n+ source regions n_1~n_k are formed with tilt implant respectively. Finally, the etching process is performed to form contact holes for completing the backside metal layer 101 and the frontside metal layer 106. Preferably, the material of the frontside metal layer 106 can be aluminum (Al).

Figure 2:
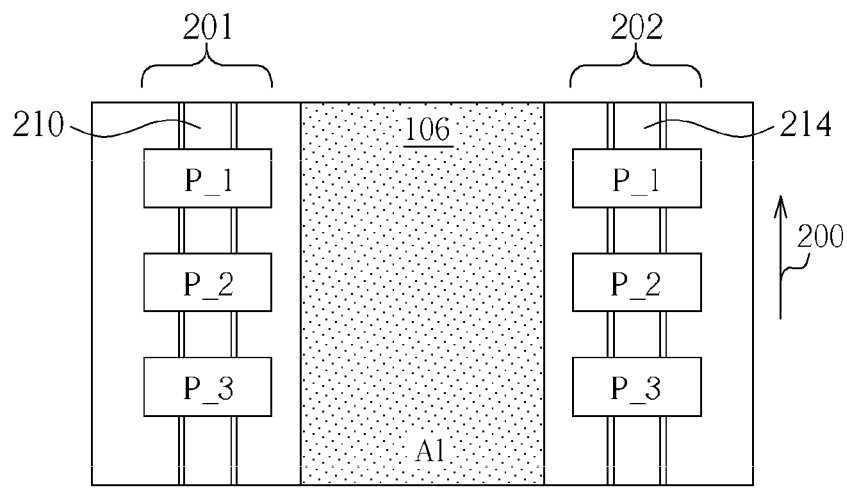
FIG. 2(a) is a top-view diagram illustrating a layout of the trench power transistor according to an embodiment of the present invention.
FIG. 2(b) is a 3D structural diagram illustrating a layout of the trench power transistor according to an embodiment of the present invention.
Figure 2:
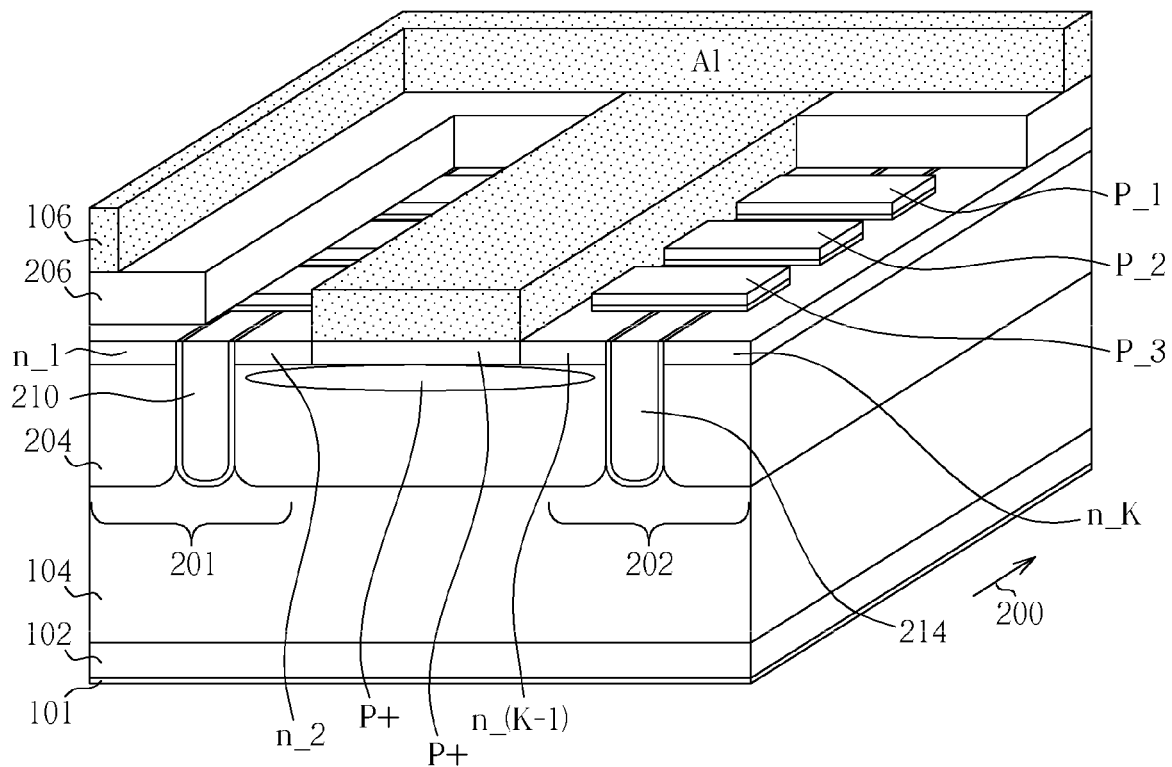
Figure 3:
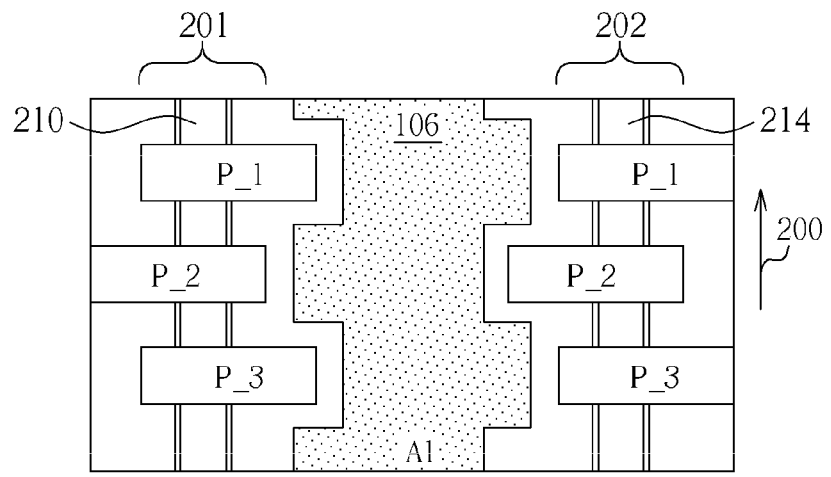
FIG. 3(a) is a top-view diagram illustrating a layout of the trench power transistor according to another embodiment of the present invention.
FIG. 3(b) is a 3D structural diagram illustrating a layout of the trench power transistor according to another embodiment of the present invention.
Figure 3:
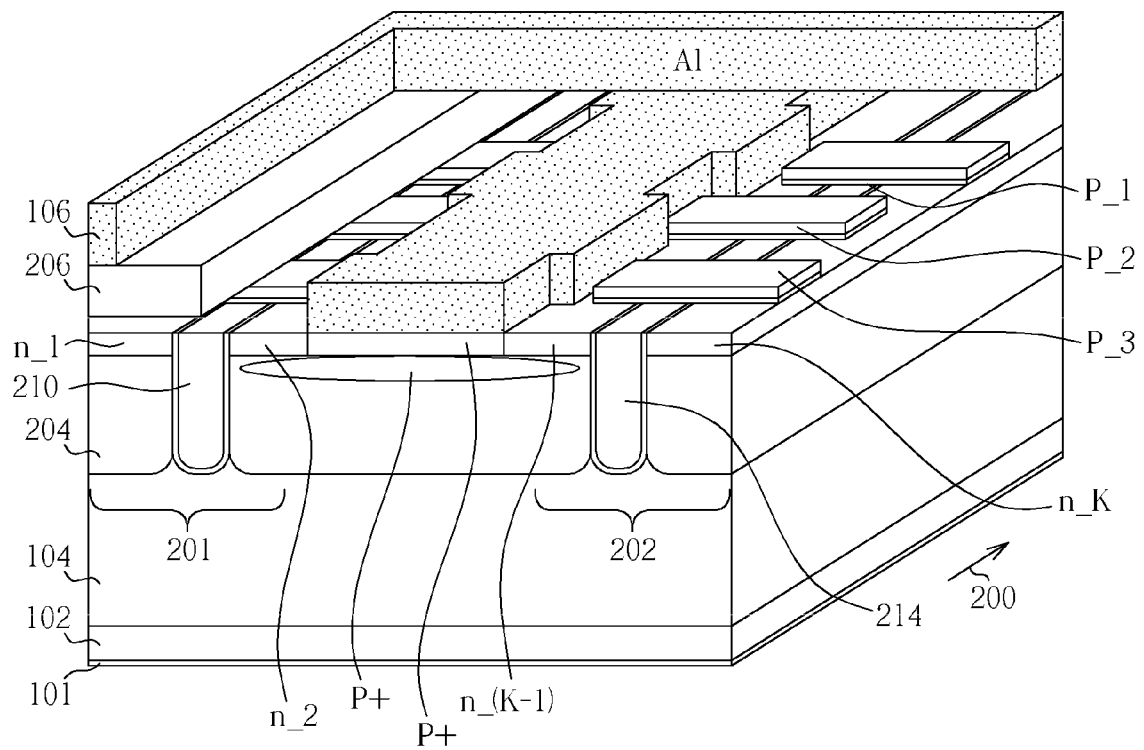
Figure 4:
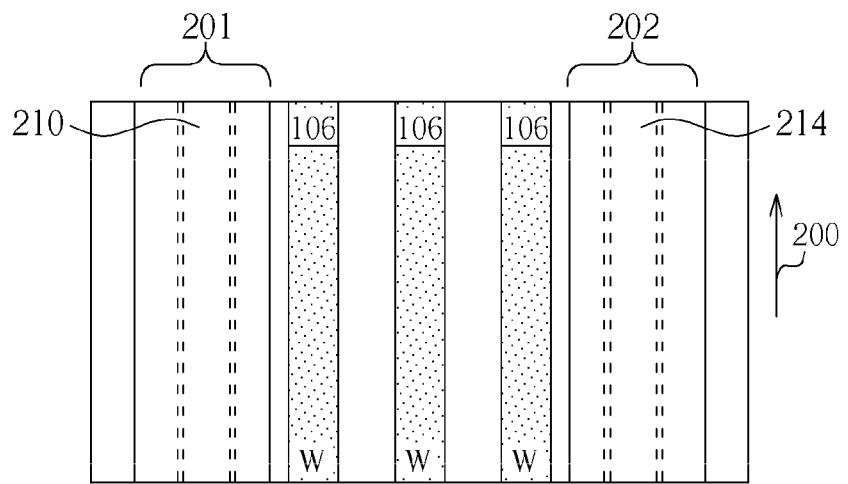
FIG. 4(a) is a top-view diagram illustrating a layout of the trench power transistor according to another embodiment of the present invention.
FIG. 4(b) is a 3D structural diagram illustrating a layout of the trench power transistor according to another embodiment of the present invention.
Figure 4:
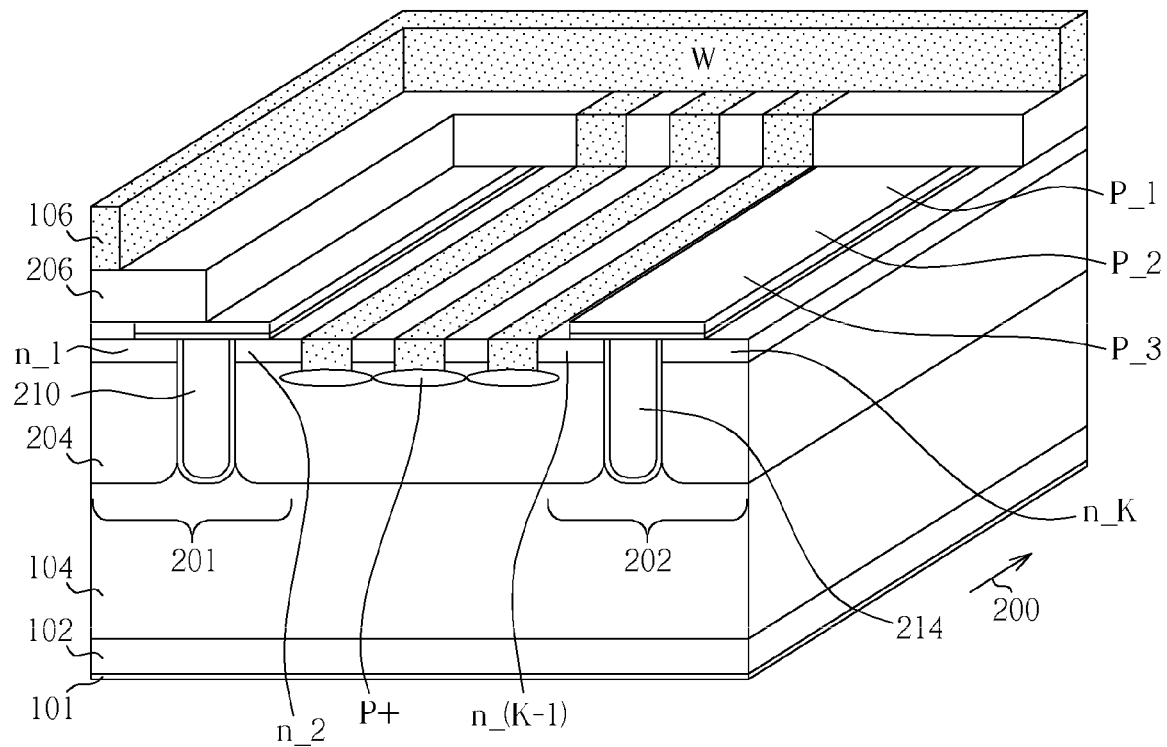

The embodiment of the present invention can improve non-uniform implant caused by mask offset or alignment error, while forming the p-base region 204 and the plurality of n+ source regions n_1~n_k with tilt implant. Please refer to FIG. 2~FIG. 7. FIG. 2~FIG. 7 are top-view diagrams and corresponding 3D structural diagrams illustrating a layout of the trench power transistor 10 according to an embodiment of the present invention respectively. Preferably, the first trench structure 201 includes a plurality of top end extension regions P with poly-Si implant, which is extended from top end of the first trench 210 to both sides of the first trench 210 respectively. For example, as shown in FIG. 2(a) and FIG. 2(b), the first trench structure 201 includes top end extension regions P_1~P_3. The top end extension regions P_1~P_3 are formed on top of the first trench 210 along a first direction 200 alternately and extended from top end of the first trench 210 to both sides of the first trench 210 with poly-Si implant. In addition, the top end extension regions P_1~P_3 are capable of various arrangement types. For example, as shown in FIG. 2 (a) and FIG. 2 (b), the top end extension regions P_1~P_3 are formed on top of the first trench 210 symmetrically. In FIG. 3 (a) and FIG. 3 (b), the top end extension regions P_1~P_3 are formed on top of the first trench 210 asymmetrically. On the other hand, the material of the frontside metal layer 106 is preferably capable of being wolfram (W). Compared to the above-mentioned frontside metal layer 106 using Al material, there are two ion implant processes used for the frontside metal layer 106 using W material. A heavy ion implant using fluoride boron (BF2+) is utilized for forming an ohmic contact layer, and a less-heavy ion implant using boron (B) is utilized for increasing lateral diffusion depth and enhancing current absorbing capability. Even more, p+ contact regions are formed under the plurality of n+ source regions for avoiding latch-up effect. Therefore, when the frontside metal layer 106 uses W material, the gaps formed between the plurality of n+ source electrode regions n_1~n_k on the p-base region 204 have various shapes and arrangement types. For example, as shown in FIGS. 4(a) and 4(b), the gaps formed between the plurality of n+ source regions n_1~n_k on the p-base region 204 are arranged in a bar form.

Figure 5:
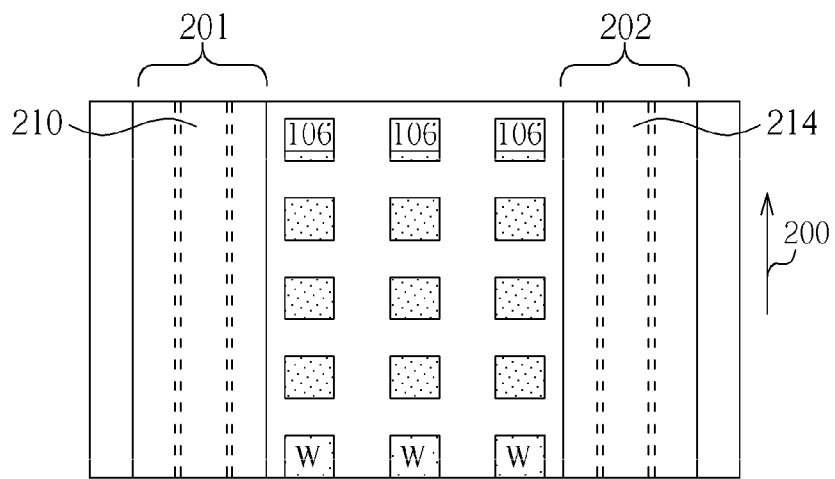
FIG. 5(a) is a top-view diagram illustrating a layout of the trench power transistor according to another embodiment of the present invention.
FIG. 5(b) is a 3D structural diagram illustrating a layout of the trench power transistor according to another embodiment of the present invention.
Figure 5:
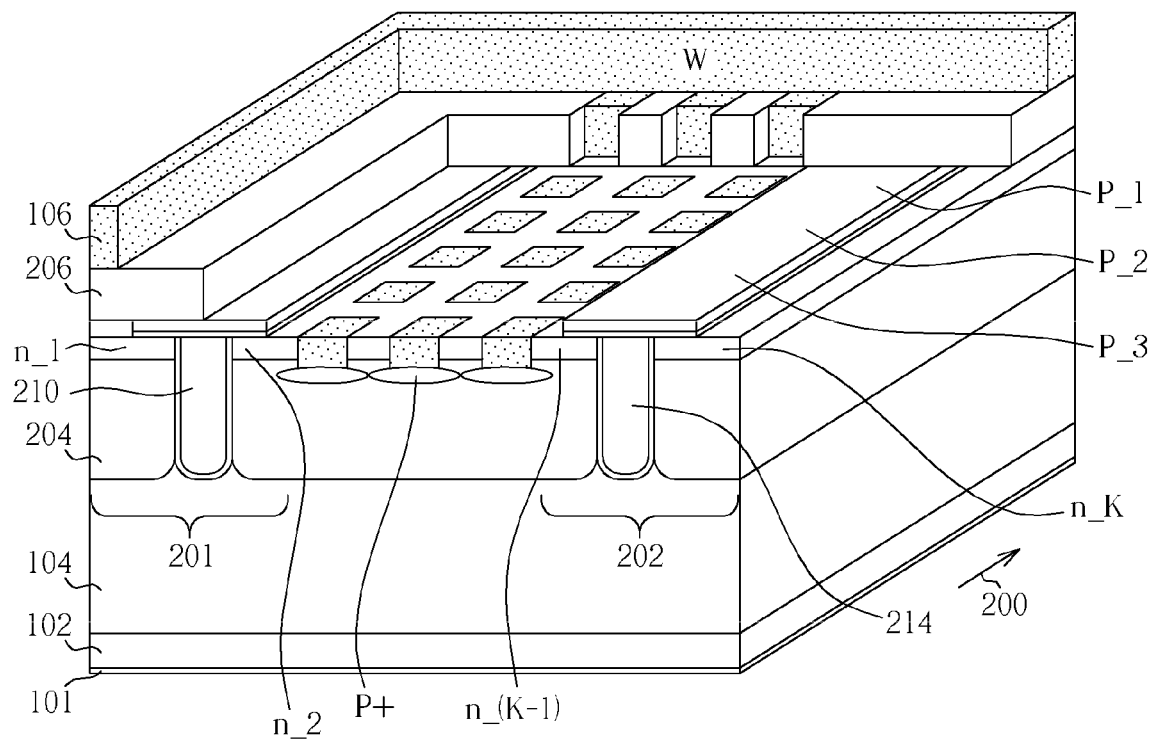
Figure 6:
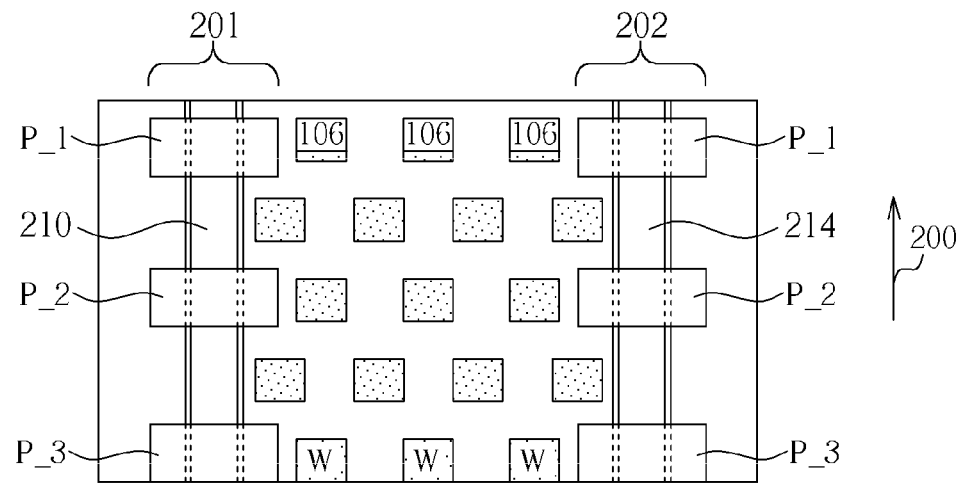
FIG. 6(a) is a top-view diagram illustrating a layout of the trench power transistor according to another embodiment of the present invention.
FIG. 6(b) is a 3D structural diagram illustrating a layout of the trench power transistor according to another embodiment of the present invention.
Figure 6:
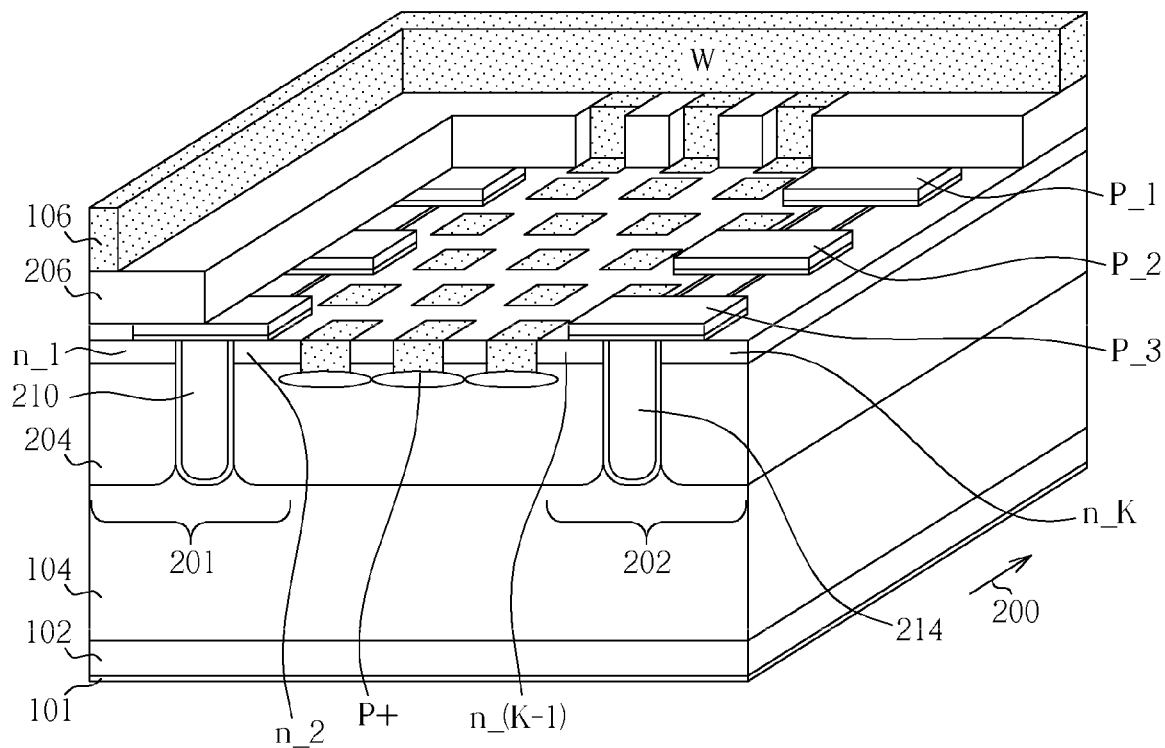

As shown in FIGS. 5(a) and 5(b), the gaps formed between the plurality of n+ source regions n_1~n_k on the p-base region 204 are arranged in a chessboard form. The above-mentioned embodiments (FIG. 2 (a)~FIG. 5 (b)) can be combined to different varied embodiments applicably. For example, please refer to FIGS. 6(a) and 6(b). If the gaps formed between the plurality of n+ source regions n_1~n_k on the p-base region 204 are arranged in a chessboard form, the top end extension regions P_1~P_3 can be formed on top of the first trench 210 symmetrically and also along a first direction 200 alternately. Besides, as shown in FIGS. 7(a) and 7(b), the top end extension regions P_1~P_3 can be formed on top of the first trench 210 asymmetrically and also along a first direction 200 alternately. Therefore, through changing the layout approach and structure mode of the trench power transistor 10, the present invention can improve the miller effect for reducing voltage spike effect produced during switching and avoid non-uniform implant for reducing unusual P-N junction avalanche and enhancing stability of manufacturing process.

Figure 7:
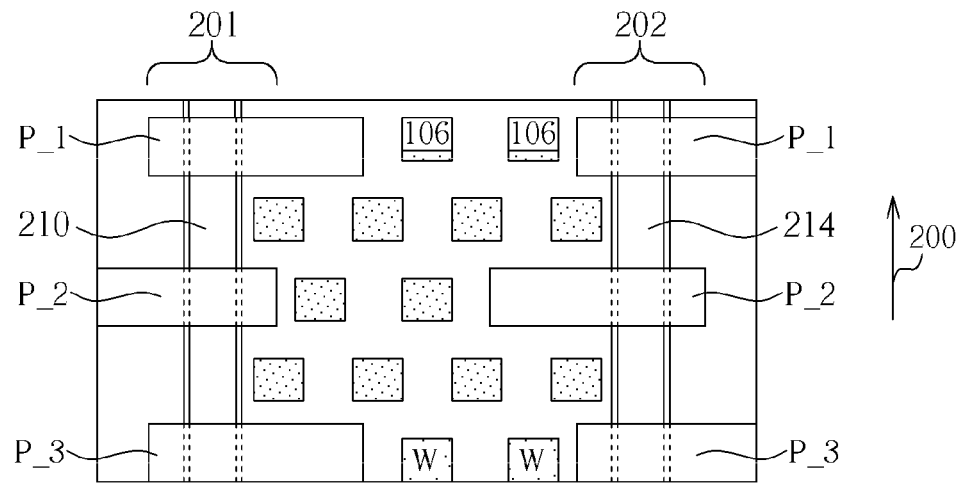
FIG. 7(a) is a top-view diagram illustrating a layout of the trench power transistor according to another embodiment of the present invention.
FIG. 7(b) is a 3D structural diagram illustrating a layout of the trench power transistor according to another embodiment of the present invention.
Figure 7:
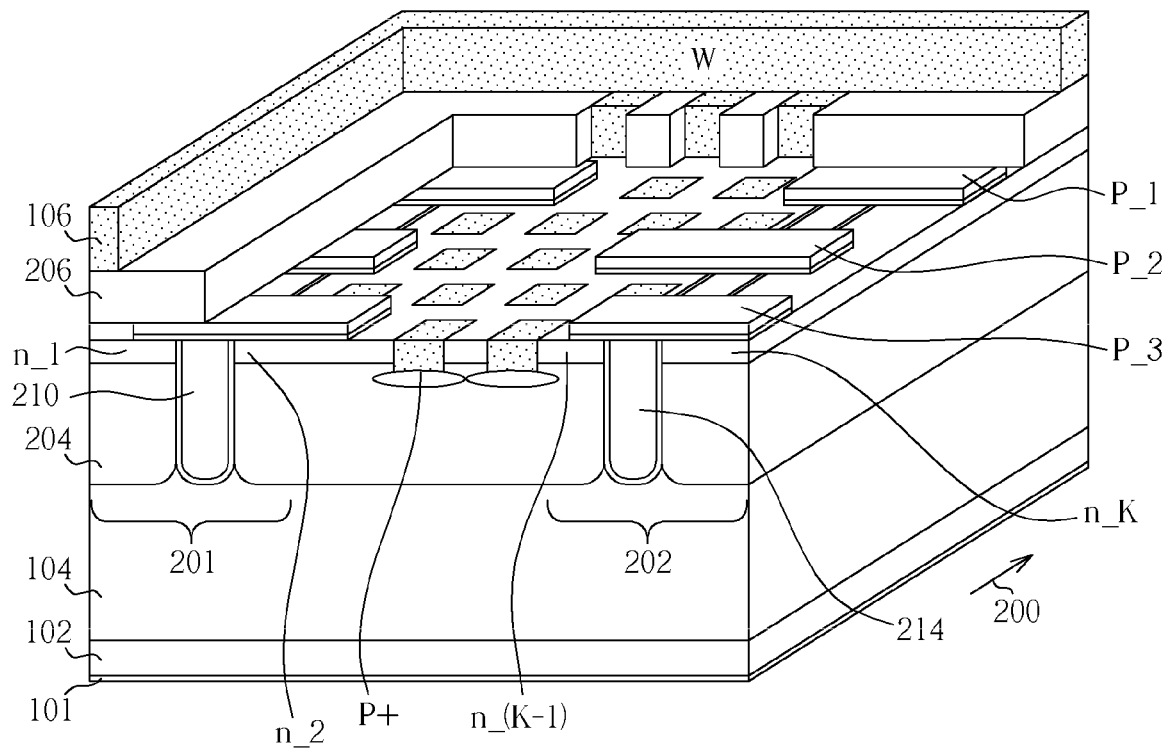

Note that, the layout of the trench power transistor 10 in FIG. 2(a), 2(b)·FIG. 7(a), 7(b) illustrate the embodiment of the present invention, and those skilled in the art can make modifications accordingly. For example, as shown in FIG. 2(a), 2(b)~FIG. 7(a), 7(b), the top end extension region P only contains top end extension regions P_1~P_3. In practice, there can be many top end extension regions under the same structure mode. In such a situation, any shapes or positions of the top end extension region P or the gaps formed between the plurality of n+ source regions n_1~n_k on the p-base region 204 is suitable, and those skilled in the art can make modifications accordingly, further explanation is omitted herein for the sake of brevity. Similarly, the layout of the second trench structure 202 is the same as the first trench structure 201. In addition, the top end extension regions P of the trench structure are arranged in square or rectangular form in the embodiments, please note that the above shapes and embodiments are only for illustrative purpose, and should not be a limitation of the present invention.

In summary, through changing the layout approach and structure mode of the trench power transistor 10, the present invention can improve the miller effect for reducing voltage spike effect produced during switching and avoid non-uniform implant for reducing unusual P-N junction avalanche and enhancing stability of manufacturing process.

Those skilled in the art will readily observe that numerous modifications and alterations of the device and method may be made while retaining the teachings of the invention.

What is claimed is:

1. A power semiconductor device, comprising:
   a backside metal layer;
   a substrate formed on the backside metal layer;
   a semiconductor layer formed on the substrate, comprising:
      a first trench structure comprising a first gate oxide layer formed around a first trench with poly-Si implant;
      a second trench structure comprising a second gate oxide layer formed around a second trench with poly-Si implant;
      a p-base region formed between the first trench structure and the second trench structure;
      a plurality of n+ source regions formed on the p-base region and between the first trench structure and the second trench structure; and
      a dielectric layer formed on the first trench structure, the second trench structure, and the plurality of n+ source regions; and a frontside metal region formed on the semiconductor layer and filling gaps formed between the plurality of n+ source regions on the p-base region, wherein the gaps are arranged in a chessboard form.

2. The power semiconductor device of claim 1, wherein the first trench structure comprises a top end extension region extended from top end of the first trench to both sides of the first trench with poly-Si implant.

3. The power semiconductor device of claim 2, wherein the gaps formed between the plurality of n+ source regions on the p-base region are separated from the top end extension region and not overlapped with the top end extension region.

4. The power semiconductor device of claim 1, wherein the first trench structure comprises a plurality of top end extension regions extended from top end of the first trench to both sides of the first trench with poly-Si implant respectively.

5. The power semiconductor device of claim 4, wherein the plurality of top end extension regions is formed on top of the first trench along a first direction alternately.

6. The power semiconductor device of claim 4, wherein the plurality of top end extension regions is formed on top of the first trench symmetrically.

7. The power semiconductor device of claim 4, wherein the plurality of top end extension regions is formed on top of the first trench asymmetrically.

8. The power semiconductor device of claim 4, wherein the plurality of top end extension regions have the same shape.

9. The power semiconductor device of claim 4, wherein the plurality of top end extension regions have different shapes.

10. The power semiconductor device of claim 4, wherein the gaps formed between the plurality of n+ source regions on the p-base region are separated from the plurality of top end extension regions and not overlapped with the plurality of top end extension regions.

11. The power semiconductor device of claim 1, wherein the gaps formed between the plurality of n+ source regions on the p-base region are arranged in a bar form.

12. The power semiconductor device of claim 1, wherein each of the gaps formed between the plurality of n+ source regions on the p-base region comprises a p+ contact region.

* * * * *